(12) United States Patent
Bae et al.

(10) Patent No.: US 9,431,471 B2
(45) Date of Patent: Aug. 30, 2016

(54) DISPLAY PANEL AND DISPLAY DEVICE HAVING THE SAME

(71) Applicant: SAMSUNG DISPLAY CO., LTD., Yongin, Gyeonggi-Do (KR)

(72) Inventors: Han-Sung Bae, Seongnam-si (KR); Yangwan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/248,284

(22) Filed: Apr. 8, 2014

(65) Prior Publication Data

US 2015/0091013 A1  Apr. 2, 2015

(30) Foreign Application Priority Data

Sep. 30, 2013  (KR) .................. 10-2013-0116577

(51) Int. Cl.
*H01L 27/32* (2006.01)
*H01L 51/00* (2006.01)

(52) U.S. Cl.
CPC ....... *H01L 27/3276* (2013.01); *H01L 51/0097* (2013.01)

(58) Field of Classification Search
CPC ................. H01L 27/3276; H01L 51/0097
See application file for complete search history.

(56) References Cited

U.S. PATENT DOCUMENTS

2006/0044237 A1* 3/2006 Lee .................. G09G 3/3233 345/82
2007/0167036 A1* 7/2007 Kim ............................ 439/66
2008/0094321 A1* 4/2008 Park et al. ................... 345/76
2011/0085122 A1* 4/2011 Fu et al. ...................... 349/149
2015/0380843 A1* 12/2015 Dubal ................... H01R 24/66 439/37

FOREIGN PATENT DOCUMENTS

| JP | 2005-197089 | 7/2005 |
|---|---|---|
| JP | 2007-188078 A | 7/2007 |
| JP | 2009-037164 A | 2/2009 |
| JP | 2013-088682 A | 5/2013 |
| KR | 10-0856640 B1 | 9/2008 |
| KR | 10-0874295 B1 | 12/2008 |
| KR | 10-2010-0095087 | 8/2010 |
| WO | WO 2010/018759 A1 | 2/2010 |

OTHER PUBLICATIONS

Korean Patent Abstracts, Publication No. KR 1020070087509 A, dated Aug. 28, 2007, for corresponding Korean Patent No. KR 10-0856640 B1, 2 pages.

Korean Patent Abstracts, Publication No. KR 1020080046553 A, dated May 27, 2008, for corresponding Korean Patent No. KR 10-0874295 B1, 2 pages.

* cited by examiner

*Primary Examiner* — Whitney T Moore
(74) *Attorney, Agent, or Firm* — Lewis Roca Rothgerber Christie LLP (57) ABSTRACT

A display panel includes a base substrate including a display area and a peripheral area, a pixel at the display area of the base substrate, a signal line coupled to the pixel and configured to apply a signal to the pixel, and a pad part including a plurality of pads at the peripheral area. The pad part being electrically coupled to the signal line, and the plurality of pads includes at least two pads having widths different from each other.

13 Claims, 5 Drawing Sheets

DISPLAY PANEL AND DISPLAY DEVICE HAVING THE SAME

CROSS-REFERENCE TO RELATED APPLICATION

This patent application claims priority to and the benefit of Korean Patent Application No. 10-2013-0116577, filed on Sep. 30, 2013 in the Korean intellectual Property Office, the content of which is hereby incorporated by reference in its entirety.

BACKGROUND

1. Field

The present disclosure relates to a display panel and a display device having the same.

2. Description of the Related Art

An organic light emitting display device is a flat panel display device in which an organic compound is used as a light emitting material. The organic light emitting display device includes a pixel portion including pixels arranged in areas defined by scan lines and data lines, a scan driver applying scan signals to the scan lines, and a data driver applying data signals to the data lines.

The pixel portion, the scan driver, and the data driver are disposed on a panel of the organic light emitting display device and receive driving power and/or a driving signal through a pad part formed at one side of the panel.

For instance, the pixel portion, the scan driver, and the data driver are electrically coupled to (e.g., electrically connected to) a film or a flexible printed circuit board, which is bonded on the panel, to receive driving power and/or the driving signal.

To stably supply driving power, a line (e.g., a wire) used to supply driving power has a wider width than that of the other lines used to supply the driving signal.

SUMMARY

Aspects of the present disclosure are directed toward a display panel having improved bonding reliability and a display device having the display panel.

Aspects of the present disclosure are also directed toward a display panel having improved bonding reliability with a flexible film.

Aspects of the present disclosure are also directed toward a display device including the display panel and the flexible film and having improved bonding reliability between the display panel and the flexible film.

Embodiments of the inventive concept include a display panel including a base substrate that includes a display area and a peripheral area, a pixel at the display area of the base substrate, a signal line coupled to (e.g., connected to) the pixel and configured to apply a signal to the pixel, and a pad part including a plurality of pads at the peripheral area, the pad part being electrically coupled to (e.g., electrically connected to) the signal line. The plurality of pads includes at least two pads having widths different from each other.

Embodiments of the inventive concept include a display device including a display panel that includes a display area and a peripheral area and a flexible film attached to the display panel. The display panel further includes a base substrate, a pixel at the display area, a signal line coupled to (e.g., connected to) the pixel and configured to apply a signal to the pixel, and a pad part including a plurality of pads at the peripheral area, the pad part being electrically coupled to (e.g., electrically connected to) the signal line. A flexible film attached to the pad part and includes a plurality of output pads electrically coupled to (e.g., electrically connected to) the pad part. At least one of the plurality of pads has a width sufficient to cover at least two of the plurality of output pads.

As described above and according to embodiments of the present invention, when the voltage line configured to transmit the driving voltage has a relatively large area, at least one of the plurality of pads of the pad part coupled to the voltage line has a width sufficient to cover two of the plurality of output pads. Thus, the pad part and the flexible film may not be mismatched with each other, which is caused due to different elongation rates at different positions of the pad part. That is, at least one of the plurality of pad portions will contact one of the plurality of output pads even if the pad part and the flexible film are out of alignment. As a result, the bonding reliability may be improved.

In addition, because the sum of the widths of all of the plurality of pads is greater than a half of the width of the voltage line, a resistance of the voltage line may be prevented from substantially increasing at the pad part.

BRIEF DESCRIPTION OF THE DRAWINGS

The above and other aspects of the present disclosure will become more readily apparent by reference to the following detailed description when considered in conjunction with the accompanying drawings, wherein.

DETAILED DESCRIPTION

It will be understood that when an element or layer is referred to as being "on", "connected to", or "coupled to" another element or layer, it can be directly on, connected, or coupled to the other element or layer; or one or more intervening elements or layers may also be present. When an element is referred to as being "directly on," "directly connected to", or "directly coupled to" another element or layer, there are no intervening elements or layers present. Like reference designators refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. Also, the device may be otherwise oriented (rotated 90 degrees or at other orientations), and the spatially relative descriptors used herein should be interpreted accordingly.

The terminology used herein is for the purpose of describing particular embodiments only and is not intended to be limiting of the invention. As used herein, the singular forms, "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Further, the use of "may" when describing embodiments of the present invention refers to "one or more embodiments of the present invention."

Hereinafter, the present invention will be explained in detail with reference to the accompanying drawings.

Figure 1:
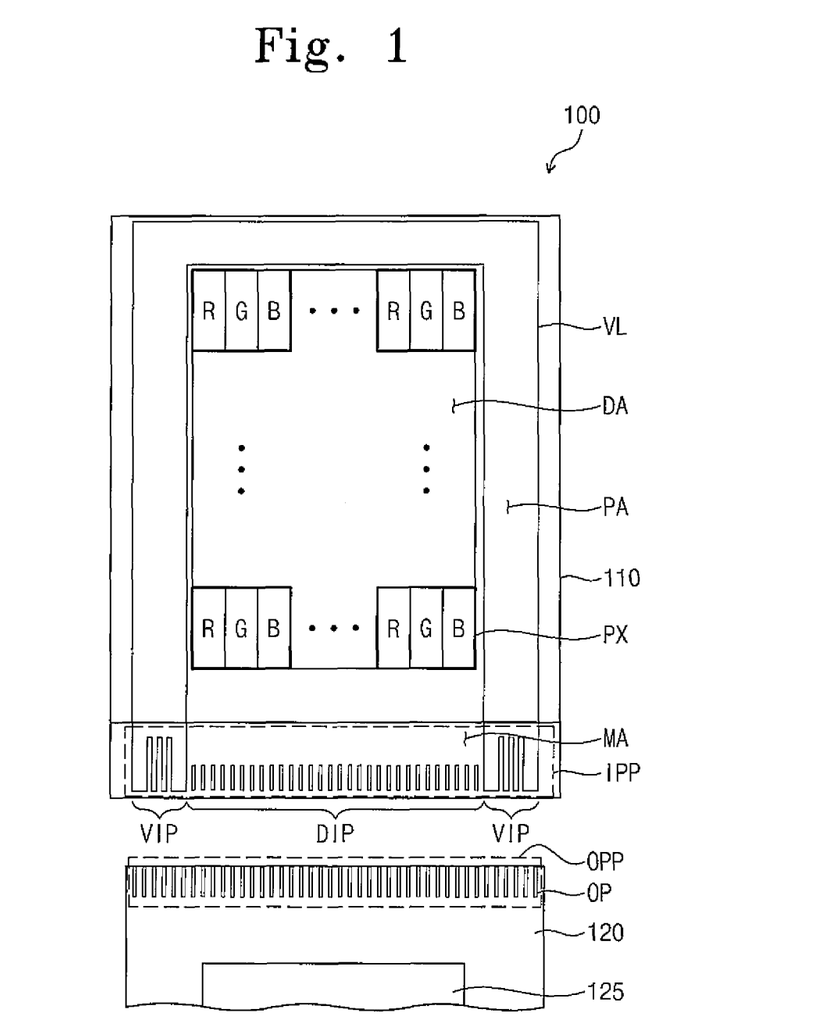
FIGS. 1 and 2 are plan views showing a bonding process between a display panel and a flexible film in a display device according to an example embodiment of the present disclosure.
Figure 2:
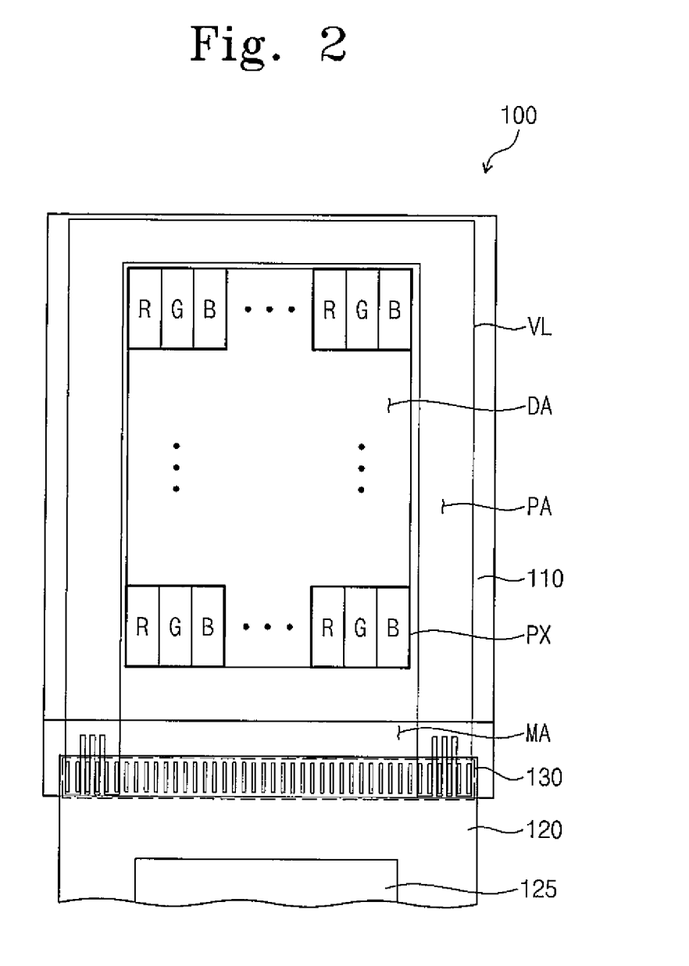

FIGS. 1 and 2 are plan views showing a bonding orientation between a display panel and a flexible film in a display device according to an example embodiment of the present disclosure.

Referring to FIG. 1, a display device 100 includes a display panel 110 and a flexible film 120 attached to the display panel 110. The display panel 110 applies a driving signal to an electro-optical material provided therein to display desired images. The display panel 110 may be a liquid crystal display panel, an organic light emitting display panel, or an electrowetting display panel according to a kind of the electro-optical material.

The display panel 110 includes a display area DA in which a plurality of pixels PX are arranged, a peripheral area PA surrounding the display area DA, and a mounting area MA at which the flexible film 120 is attached. The pixels PX are arranged in the display area DA in a matrix form, and the images are displayed through the display area DA (that is, the images are emitted at the display area DA). As an example, each pixel PX may include first, second, and third sub-pixels R, G, and B that represent (e.g., that are configured to emit) red, green, and blue colors, respectively. The peripheral area PA includes a black matrix therein to block light (that is, the peripheral area PA blocks light from transmitting therethrough). For instance, a scan driver may be disposed in the peripheral area PA to apply a scan signal to the pixels PX.

An input pad part IPP is arranged at the mounting area MA to receive a signal provided from the flexible film 120. When a data driver 125 that applies a data signal to the pixels PX is mounted on the display panel 110 as a chip or the like, the input pad part IPP may include pads used to apply display data and control signals to the data driver 125. When the data driver 125 is mounted on the flexible film 120 as the chip, the input pad part IPP may include a data pad electrically coupled to (e.g., electrically connected to) data lines that apply the data signals to the pixels PX and a control signal pad electrically coupled to (e.g., electrically connected to) control signal lines that apply the control signals to the data driver.

Meanwhile, FIG. 1 shows a chip on film (COF) structure in which the data driver 125 is mounted on the flexible film 120 as the chip. In this case, the data pad and the control signal pad are commonly designated as "data input pads DIP".

As an example, a voltage source line VL that transmits a driving voltage (e.g., ELVDD or ELVSS) may be disposed in the peripheral area PA. The voltage source line VL is coupled to (e.g., connected to) the pixels PX arranged in the display area DA to supply the driving voltage to the pixels PX. In addition, according to another embodiment, the voltage source line VL is coupled to (e.g., connected to) a scan driver in the display panel 110 to supply the driving voltage to the scan driver.

The voltage source line VL may have a width wider than that of the other signal lines that apply the scan signals and the data signals to the pixels PX in order to stably supply the driving voltage.

The input pad part IPP further includes a plurality of voltage source input pads VIP coupled to (e.g., connected to) the voltage source line VL. The voltage source input pads VIP may have various widths (e.g., widths different from each other), and each of the voltage source input pads VIP may have a width smaller than that of the voltage source line VL. In addition, at least one of the voltage source input pads VIP may have the width wider than that of one of the data input pads DIP.

As shown in FIG. 1, an output pad part OPP is disposed on a rear surface of the flexible film 120, which faces the display panel 110, and is electrically coupled to (e.g., electrically connected to) the input pad part IPP. The output pad part OPP includes output pads OP electrically coupled to (e.g., electrically connected to) the data input pads DIP and the voltage source input pads VIP. As an example, the output pads OP may each have substantially the same width. The output pads OP may be arranged substantially parallel to the data input pads DIP and may each have substantially the same width as each of the data input pads DIP.

At least one voltage source input pad of the voltage source input pads VIP may have a width corresponding to two output pads OP (that is, at least one of the voltage source input pads VIP may have a width that is sufficient to cover two of the plurality of output pads OP).

Referring to FIG. 2, the flexible film 120 is attached at the mounting area MA of the display panel 110. To this end, a conductive adhesive film 130 may be between the flexible film 120 and the display panel 110. As an example, an anisotropic conductive film may be used as the conductive adhesive film 130.

When the flexible film 120 and the display panel 110 are disposed such that the input pad part IPP and the output pad part OPP face each other, the anisotropic conductive film 130 is between the flexible film 120 and the display panel 110. Then, when heat and pressure are applied to the mounting area MA of the display panel 110 utilizing a separate tool or process, the input pad part IPP and the output pad part OPP are electrically coupled to (e.g., electrically connected to) each other, and the flexible film 120 is attached to the display panel 110.

Figure 3:
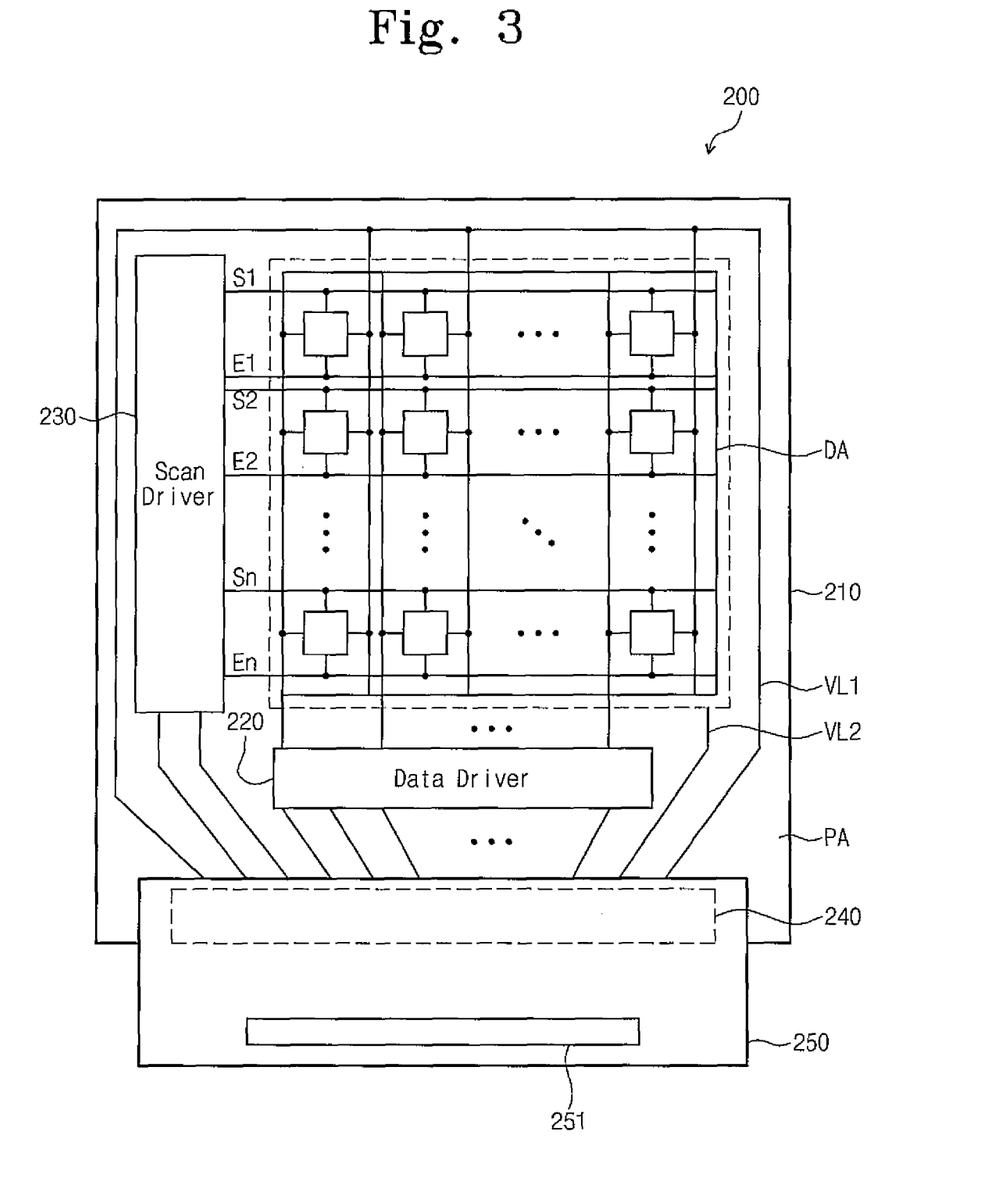
FIG. 3 is a plan view showing an organic light emitting display device according to an example embodiment of the present disclosure.

FIG. 3 is a plan view showing an organic light emitting display device according to an example embodiment of the present disclosure.

Referring to FIG. 3, an organic light emitting display device 200 includes a base substrate 210, a data driver 220, a scan driver 230, pixels PX, and a pad part 240, which are disposed on the base substrate 210, and a flexible film 250.

The base substrate 210 may be glass or film having a flexible characteristic. The base substrate 210 includes a display area DA, in which the pixels PX are arranged in a matrix form, and a peripheral area PA surrounding the display area DA.

The scan driver 230 is disposed in the peripheral area PA and generates scan signals and light emitting control signals in response to driving voltage and control signals from an external source. The scan signals are sequentially applied to scan lines S1 to Sn and the light emitting control signals are sequentially applied to light emitting control lines E1 to En.

Therefore, the pixels PX sequentially receive the data signals while being selected by the scan signals.

As an example, the configuration in which the scan driver 230 generates the light emitting control signals has been explained, but the present invention should not be limited thereto or thereby. That is, according to another embodiment, a light emitting control driver that generates the light emitting control signal may be further provided and the light emitting control driver may sequentially apply the light emitting control signals to light emitting control lines E1 to En arranged substantially parallel to the scan lines S1 to Sn.

In addition, the scan driver 230 may be mounted (e.g., separately mounted) on the base substrate 210 as a chip, but the present invention is not thereby limited. For example, the scan driver 230 may be in the panel with driving devices included in (or integrated with) the pixels PX to form an inner circuit part.

Meanwhile, the scan driver 230 is disposed at one side of the display area DA shown in FIG. 3, but the scan driver 230 may be disposed at either side of the display area DA. In addition, when the light emitting control driver is provided separate from the scan driver 230, the scan driver 230 and the light emitting control driver may be disposed at both sides (e.g., opposite sides) of the display area DA, which face each other.

The data driver 220 generates data signals in response to data and control signals from an external source. The data signals generated by the data driver 220 are applied to the data lines D1 to Dm to be synchronized with the scan signals. The data signals applied to the data lines D1 to Dm are applied to the pixels PX when the scan signals are provided, and thus the pixels PX are charged with the voltage corresponding to the data signals.

Each of the pixels PX may be disposed at area defined in association with (i.e., generally defined by) the scan lines S1 to Sn, the light emitting control lines E1 to En, and the data lines D1 to Dm. Each pixel is formed at the area partitioned by the scan lines S1 to Sn, the light emitting control lines E1 to En, and the data lines D1 to Dm.

The pad part 240 makes contact with the flexible film 250 and receives various signals from a driving chip 251 mounted on the flexible film 250. The data driver 220 and the scan driver 230 are electrically coupled to (e.g., electrically connected to) the pad part 240 through connection lines.

In addition, each pixel PX receives a first driving voltage ELVDD and a second driving voltage ELVSS. Each pixel PX, which receives the first driving voltage ELVDD and the second driving voltage ELVSS, is selected (e.g., is engaged) when the scan signal is provided thereto, and thus, the selected pixel PX receives the data signal. In this case, a current flows through the pixel PX corresponding to the data signal from the first driving voltage ELVDD to the second driving voltage ELVSS through light emitting material (or light emitting device) in each pixel PX, thereby displaying the image.

A first voltage line VL1 supplying the first driving voltage ELVDD to the pixels PX is disposed along the peripheral area PA and both ends of the first voltage line VL1 are connected to the pad part 240.

As an example, a cathode electrode is disposed over the whole surface of the display area DA to commonly correspond to the pixels PX, and the cathode electrode receives the second driving voltage ELVSS. One end of a second voltage line VL2, which supplies the second driving voltage ELVSS to the cathode electrode, is coupled to (e.g., connected to) the cathode electrode and the other end of the second voltage line VL2 is coupled to (e.g., connected to) the pad part 240.

However, the connection structure between the pad part 240 and the first and second voltage lines VL1 and VL2 should not be limited to the above-mentioned structure.

Hereinafter, a structure of the pad part 240 will be described in more detail with reference to FIGS. 4 to 7.

Figure 4:
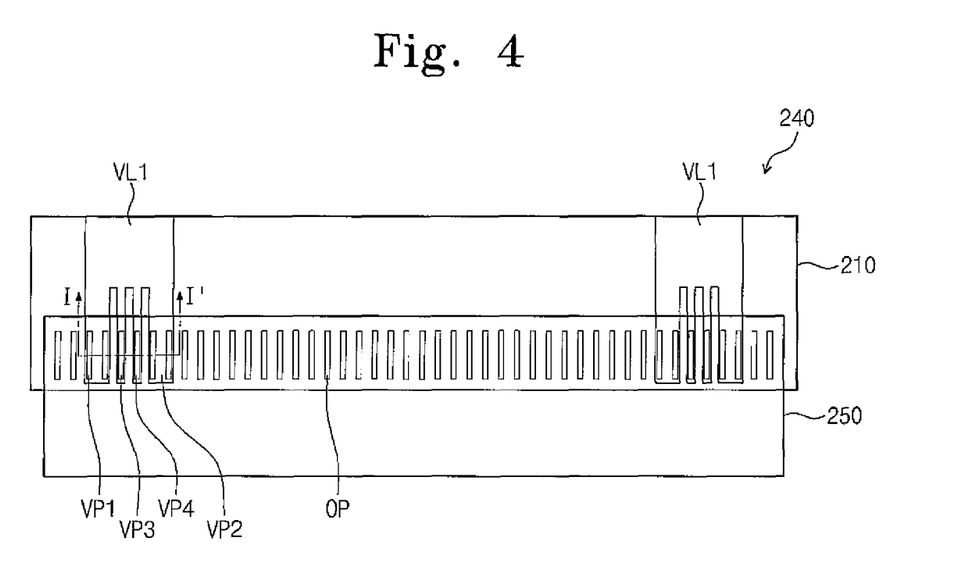
FIG. 4 is an enlarged view showing a pad part of the organic light emitting display device shown in FIG. 3.
Figure 5:
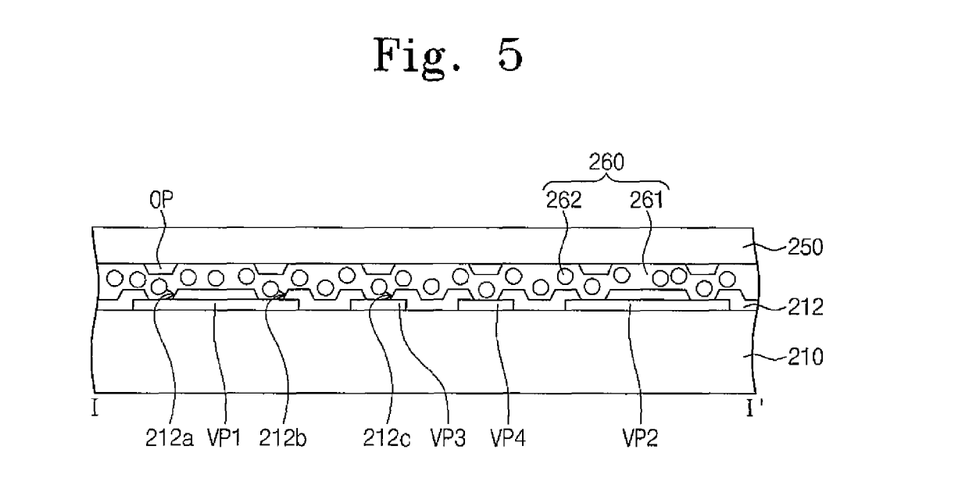
FIG. 5 is a cross-sectional view taken along the line I-I' of FIG. 4.

FIG. 4 is an enlarged view showing the pad part 240 shown in FIG. 3, and FIG. 5 is a cross-sectional view taken along the line I-I' of FIG. 4. For convenience of explanation, the pad structure of the first voltage line VL1 will be described in FIGS. 4 and 5 as a representative example.

Referring to FIGS. 4 and 5, the flexible film 250 is disposed to face the pad part 240.

The pad part 240 includes a first voltage pad part (e.g., a first voltage pad portion) coupled to (e.g., connected to) a first end of the first voltage line VL1 and a second voltage pad part (e.g., a second voltage pad portion) coupled to (e.g., connected to) a second end of the first voltage line VL1. The first and second voltage pad parts may have substantially the same or the same structure or different structures.

In FIG. 4, the first and second voltage pad parts having the same structure have been shown. Accordingly, the first voltage pad part will be described in more detail with reference to FIGS. 4 and 5, and a detailed description of the second voltage pad part may be omitted.

The first voltage pad part includes first, second, third, and fourth voltage pads VP1, VP2, VP3, and VP4. The first voltage pad VP1 and the second voltage pad VP2 are disposed at outermost positions among the first to fourth voltage pads VP1 to VP4, and the third and fourth voltage pads VP3 and VP4 are disposed between the first and second voltage pads VP1 and VP2. The first to fourth voltage pads VP1 to VP4 are coupled to (e.g., connected to) to a first end of the first voltage line VL1.

The first and second voltage pads VP1 and VP2 may have substantially the same width or widths different from each other. The width of each of the first and second voltage pads VP1 and VP2 is smaller than that of the first voltage line VL1 but greater than that of each of the output pads OP. As an example, the width of each of the first and second voltage pads VP1 and VP2 may be substantially equal to a sum of the widths of two output pads OP and a distance between the two output pads OP (that is, the width of each of the first and second voltage pads VP1 and VP2 may be such that they each overlap two of the output pads OP and a space between the two of the output pads OP).

The third and fourth voltage pads VP3 and VP4 are disposed between the first and second voltage pads VP1 and VP2. As an example, each of the third and fourth voltage pads VP3 and VP4 may have substantially the same width as that of each of the output pads OP.

In addition, a sum of the widths of the first to fourth voltage pads VP1 to VP4 is less than that of the first voltage line VL1.

Because the voltage pads are disposed in the first voltage pad part coupled to (e.g., connected to) the first voltage line VL1, the pad part 240 and the flexible film 250 may be prevented from being mismatched with each other, which is caused by an elongation rate difference according to a position of the pad part 240.

In addition, at least one voltage pad VP1 or VP2, which has the width smaller than that of the first voltage line VL1 but greater than that of one of the output pads OP, is disposed at the first voltage pad part. Therefore, the sum of the widths of the first to fourth voltage pads VP1 to VP4 of the first voltage pad part may be greater than a half of the width of the first voltage line VL1 at the pad part 240. As a result, a resistance of the first voltage line VL1 may be prevented from substantially increasing at the pad part 240. Here, the width of the first voltage line VL1 indicates the width of a portion thereof adjacent to the pad part 240 (e.g., the width of the first voltage line VL1 at an end portion thereof).

As shown in FIG. 5, the first to fourth voltage pads VP1 to VP4 are disposed on the base substrate 210. The third and fourth voltage pads VP3 and VP4 may have widths each substantially the same as that of one of the output pads OP, and the first and second voltage pads VP1 and VP2 may have widths each substantially equal to the sum of the widths of two of the output pads OP and a distance between the two output pads OP.

The first to fourth voltage pads VP1 to VP4 are covered (e.g., partially covered) by a cover layer 212 formed of an insulating material. The cover layer 212 may be the same as one of the insulating layers disposed in the display area DA and include at least one of an inorganic insulating material and/or an organic insulating material.

The cover layer 212 is provided with a plurality of contact openings (e.g., contact holes) formed therethrough to expose (e.g., to expose a portion of each of) the first to fourth voltage pads VP1 to VP4. Each of the contact openings have substantially the same size.

As an example, each of the first and second voltage pads VP1 and VP2 is exposed through at least first and second contact openings 212a and 212b and each of the third and fourth voltage pads VP3 and VP4 is exposed through at least a third contact opening 212c. The first, second, and third contact openings 212a, 212b, and 212c may have substantially the same size.

An anisotropic conductive film 260 is between the pad part 240 and the flexible film 250. The anisotropic conductive film 260 includes an adhesive material 261 having an insulating property and a plurality of conductive particles 262 distributed in the adhesive material 261.

Thus, the flexible film 250 may be attached to the pad part 240, and the output pads OP may be electrically coupled to (e.g., electrically connected to) the first to fourth voltage pads VP1 to VP4 through the conductive particles 262. For example, the conductive particles 262 are melted by a bonding process utilizing pressure, and thus, the output pads OP and the first to fourth voltage pads VP1 to VP4 may be electrically coupled to (e.g., electrically connected to) each other in a vertical direction (i.e., a direction along which the flexible film 250 and the pad part 240 face each other).

The second voltage line VL2 may have the similar pad structure as that of the first voltage line VL1.

Figure 6:
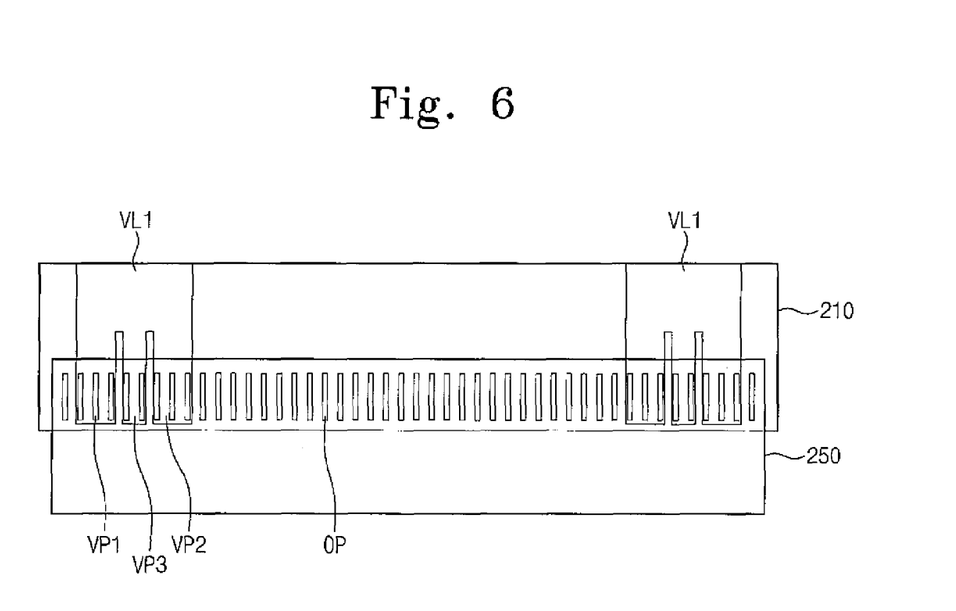
FIG. 6 is an enlarged view showing a pad part according to another example embodiment of the present disclosure.

FIG. 6 is an enlarged view showing a pad part according to another example embodiment of the present disclosure.

Referring to FIG. 6, a single third voltage pad VP3 is disposed between first and second voltage pads VP1 and VP2. In this case, the third voltage pad VP3 has a width greater than that of the third voltage pad VP3 shown in FIGS. 4 and 5. For instance, the width of the third voltage pad VP3 shown in FIG. 6 may be substantially equal to a sum of the widths of two output pads OP and a distance between the two output pads OP.

In addition, the first and second voltage pads VP1 and VP2 shown in FIG. 6 have substantially the same width, that width being greater than that of the first and second voltage pads VP1 and VP2 shown in FIG. 5. Each of the first and second voltage pads VP1 and VP2 shown in FIG. 6 may have a width sufficient to cover or overlap three of the output pads OP and spaces between the three output pads OP.

Figure 7:
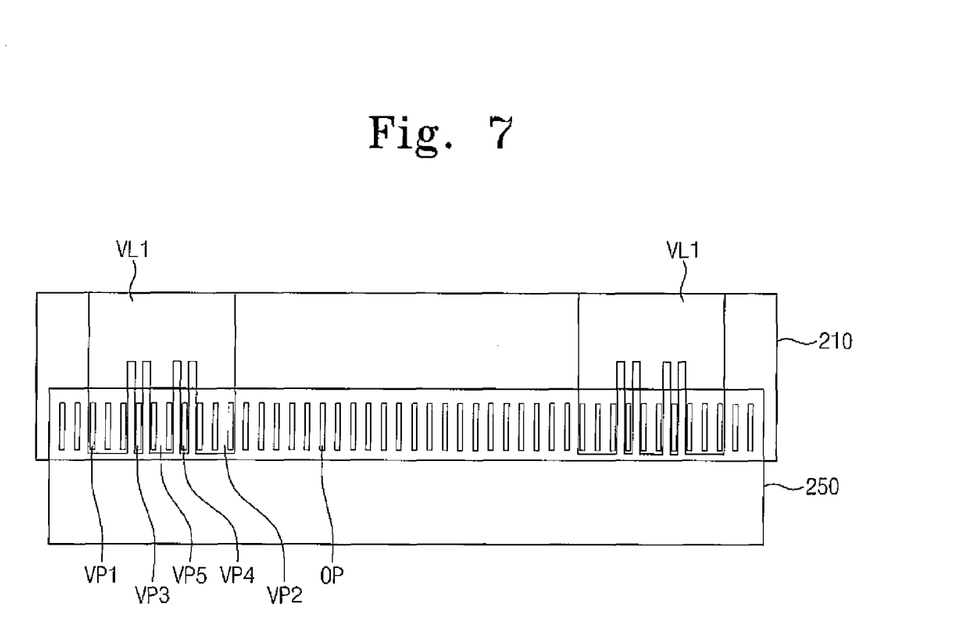
FIG. 7 is an enlarged view showing a pad part according to another example embodiment of the present disclosure.

FIG. 7 is an enlarged view showing a pad part according to another example embodiment of the present disclosure.

Referring to FIG. 7, third, fourth, and fifth voltage pads VP3, VP4, and VP5 may be disposed between first and second voltage pads VP1 and VP2. In this case, the third and fourth voltage pads VP3 and VP4 may have a width corresponding to a width of one of the output pads OP. The fifth voltage pad VP5 is disposed between the third and fourth voltage pads VP3 and VP4 and has a width sufficient to cover or overlap two of the output pads OP and a space between the two output pads OP.

In addition, the first and second voltage pads VP1 and VP2 have substantially the same width, that width being sufficient to cover or overlap three of the output pads OP and spaces between the three output pads OP.

As shown in FIGS. 4 to 7, the number of the voltage pads coupled to (e.g., connected to) the first voltage line VL1 may be varied depending on the width of the first voltage line VL1. In addition, the width and the arrangement of the voltage pads should not be limited to the above-mentioned widths and arrangements.

The voltage pads VP1 to VP5 are disposed at the first voltage pad part and are coupled to (e.g., connected to) the first voltage line VL1. However, the sum of the widths of the voltage pads VP1 to VP5 is less than the width of the first voltage line VL1. Accordingly, the pad part 240 and the flexible film 250 may be prevented from being mismatched with each other, which is caused by an elongation rate difference according to positions of the pad part 240.

In addition, at least one voltage pad, which has the width smaller than that of the first voltage line VL1 but greater than that of one of the output pads OP, is disposed at the first voltage pad part. Therefore, the sum of the widths of the first to fifth voltage pads VP1 to VP5 of the first voltage pad part may be greater than a half of the width of the first voltage line VL1 at the pad part 240 (e.g., greater than a half of the width of the first voltage line VL1 at an end portion thereof). As a result, the resistance of the first voltage line VL1 may be prevented from substantially increasing at the pad part 240.

Although example embodiments of the present invention have been described herein, it is understood that the present invention should not be limited to these example embodiments but various changes and modifications can be made by one of ordinary skilled in the art within the spirit and scope of the present invention as hereinafter claimed and equivalents thereof.

What is claimed is:

1. A display device comprising:
   a display panel comprising a display area and a peripheral area; and
   a film attached to the display panel, the display panel further comprising:
   a base substrate;
   a pixel disposed at the display area;
   a voltage signal line coupled to the pixel and configured to apply a voltage signal to the pixel; and
   a plurality of voltage pads disposed at the peripheral area, at least two of the voltage pads being electrically and physically coupled to an end portion of the voltage signal line,
   wherein a film is attached to the peripheral area and comprises a plurality of output pads electrically coupled to the plurality of voltage pads,
   wherein the at least one of the plurality of voltage pads has a width sufficient to be connected to at least two of the plurality of output pads, and
   wherein the at least two voltage pads have widths different from each other.

2. The display device of claim 1, wherein each of the voltage pads has a width smaller than a width of the voltage signal line.

3. The display device of claim 2, wherein a sum of the widths of each of the plurality of voltage pads is substantially equal to or greater than a half of the width of the voltage signal line.

4. The display device of claim 1, wherein the display panel further comprises a cover layer covering the plurality of voltage pads, and the cover layer comprises a plurality of contact openings exposing a portion of each of the plurality of voltage pads.

5. The display device of claim 4, wherein the plurality of contact openings are substantially a same size.

6. The display device of claim 1, wherein the base substrate comprises another flexible film.

7. The display device of claim 1, wherein the voltage signal line is a driving voltage line configured to supply a driving voltage to the pixel.

8. The display device of claim 7, further comprising a second voltage line coupled to the pixel and configured to supply a second driving voltage to the pixel; and
   an other plurality of voltage pads at the peripheral area, the other plurality of voltage pads being electrically coupled to the second voltage line,
   wherein at least two of the other plurality of voltage pads have widths different from each other.

9. The display device of claim 1, further comprising a conductive adhesive film coupling the display panel and the film, and the display panel electrically contacts the film through the conductive adhesive film.

10. The display device of claim 9, wherein the conductive adhesive film comprises an anisotropic conductive film.

11. The display device of claim 1, wherein at least an other one of the plurality of voltage pads has a width substantially equal to a width of one of the plurality of output pads.

12. The display device of claim 1, wherein at least an other one of the plurality of voltage pads has a width sufficient to cover at least three of the plurality of output pads.

13. The display device of claim 12, where at least a third of the plurality of voltage pads has a width substantially equal to a width of one of the plurality of output pads.

* * * * *